United States Patent [19]

Harada

[11] Patent Number: 4,962,727
[45] Date of Patent: Oct. 16, 1990

[54] THIN FILM-FORMING APPARATUS

[75] Inventor: Shigeru Harada, Itami, Japan

[73] Assignee: Mitsubishi Denki Kabushiki Kaisha, Japan

[21] Appl. No.: 381,846

[22] Filed: Jul. 19, 1989

[30] Foreign Application Priority Data

Sep. 12, 1988 [JP] Japan .................................. 63-229307

[51] Int. Cl.$^5$ .............................................. C23C 16/50
[52] U.S. Cl. ...................................... 118/723; 118/725; 427/13; 427/38; 427/248.1
[58] Field of Search ........................ 118/723, 725, 628; 204/192.12, 192.31, 298; 427/35, 38, 39, 13, 248.1, 255.2

[56] References Cited

U.S. PATENT DOCUMENTS

| 4,633,809 | 1/1987 | Hirose et al. | 118/719 |
| 4,664,938 | 5/1987 | Walker | 118/723 |
| 4,676,195 | 6/1987 | Yasui et al. | 118/723 |
| 4,805,555 | 2/1989 | Itoh | 118/719 |
| 4,811,690 | 3/1989 | Kawagoe et al. | 118/723 |

FOREIGN PATENT DOCUMENTS

| 60-211067 | 10/1985 | Japan | 204/298 |
| 60-218466 | 11/1985 | Japan | 118/723 |
| 61-172335 | 8/1986 | Japan | 156/345 |
| 61-295375 | 12/1986 | Japan | 118/723 |
| 62-47484 | 3/1987 | Japan | 118/723 |
| 62-124284 | 6/1987 | Japan | 118/723 |

OTHER PUBLICATIONS

Shintani et al., "SiO$_2$ Particulates Dispersed in CVD Reactor" J. Electrochem. Soc., vol. 124, No. 11, pp. 1771–1776, (1977).

"Dielectric and Polysilicon Film Deposition" VLSI Technology, S. Z. Sxe, McGraw Hill, pp. 93–128.

Primary Examiner—Norman Morgenstern
Assistant Examiner—Terry J. Owens
Attorney, Agent, or Firm—Leydig, Voit & Mayer

[57] ABSTRACT

A thin film-forming apparatus includes a vessel defining a reaction chamber, a stage for holding an object for processing within the reaction chamber, and members for introducing reaction gases into the reaction chamber. The apparatus further has an electrode disposed at the periphery of the object held by the stage for capturing particles which do not contribute to the formation of a thin film on the object, and a power source for applying a direct-current voltage to the electrode. By virtue of this arrangement, the apparatus is capable of preventing adhesion of foreign particles to the object, and is thus capable of forming high-quality films with a high yield.

5 Claims, 4 Drawing Sheets

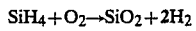

THIN FILM-FORMING APPARATUS

BACKGROUND OF THE INVENTION

1. Field of the Invention

The present invention relates to a thin film-forming apparatus used in the manufacture of semiconductor devices.

2. Description of the Related Art

Semiconductor devices are improving remarkably. Their integration density is becoming higher, with rapid progress in miniaturization of the entire device and in reduction in thickness of the thin films used. In the meantime, however, a problem arises in that if foreign particles are incorporated into a thin film, this may cause defects in the pattern of the thin film which in turn may lead to a reduction in reliability.

FIG. 1 is a view showing the overall structure of a conventional thin film-forming apparatus. This apparatus is a vertical-type atmospheric pressure chemical vapor deposition apparatus (hereinafter simply referred to as an "atmospheric pressure CVD apparatus"). Referring to the drawing, the apparatus includes a vessel 1 defining a reaction chamber A, a gas dispersion head 2 which is mounted on the upper portion of the vessel 1 and through which gases for forming a thin film are supplied to the reaction chamber A, gas supply pipes 3 connected to the gas dispersion head 2, a stage 4 provided on the lower portion of the vessel 1 and in opposition to the gas dispersion head 2, and a heater 5 provided within the stage 4. Reference numeral 6 designates a substrate to be processed by forming a thin film thereon. The substrate 6 is, for instance, a wafer formed of single crystal silicon. The apparatus further includes an exhaust port 7 formed in the peripheral portion of the bottom face of the vessel 1. The flow of gases within the reaction chamber A is indicated by arrows 8.

Next, an explanation will be given concerning a method of forming, for instance, a silicon oxide film, using this atmospheric pressure CVD apparatus.

First, the wafer 6 is conveyed into the reaction chamber A through a conveyance port (not shown) and is then placed upon the stage 4. At this time, the stage 4 already has its temperature set at a predetermined temperature of, e.g., about 350 to 450° C., by the action of the heater 5.

Subsequently, gases used to form a thin film are supplied from a gas supply source (not shown) into the gas supply pipes 3, thereby introducing the gases into the reaction chamber A through the gas dispersion head 2. If a silicon oxide film is to be formed, the gases used are reaction gases such as monosilane ($SiH_4$) gas and oxygen ($O_2$) gas, and a carrier gas such as nitrogen ($N_2$) gas. The monosilane ($SiH_4$), oxygen ($O_2$), and nitrogen ($N_2$) gases used in this example are supplied into pipes 3a, 3b, and 3c, respectively, forming the gas supply pipes 3. The gases are then supplied in their mixed state through an unillustrated nozzle portion of the gas dispersion head 2 toward the wafer 6 disposed below.

A part of the reaction gases, etc., within the reaction chamber A is exhausted to the outside through the exhaust port 7 located on the periphery of the stage 4. At this time, the remaining part of the gases within the reaction chamber A forms a flow, such as that indicated by the arrows 8 in FIG. 1, whereby the reactive gases are evenly supplied to the surface of the wafer 6. As a result, the reaction expressed by the following formula takes place on the surface of the wafer 6:

$$SiH_4 + O_2 \rightarrow SiO_2 + 2H_2$$

A silicon oxide film is formed on the surface of the wafer 6 in this way.

However, since the gases supplied fill the entire reaction chamber A, the result is that while a silicon oxide film 12 is formed on the surface of the wafer 6, as shown in FIG. 2, silicon oxide molecules also adhere to the inner wall surface 1a of the vessel 1. Silicon oxide molecules adhering to the inner wall surface 1a gradually grow as the film-forming operation is repeated, resulting in the formation of a deposit 11. As this deposit 11 grows, some of it may peel off from the inner wall surface 1a, and some of the peeled-off deposit may even adhere to the surface of the wafer 6 being processed. Furthermore, since the reaction which results in the generation of silicon oxide also takes place in the atmosphere above the wafer 6, the resultant silicon oxide molecules may cohere to form particles 9. These particles 9 may adhere to the surface of the wafer 6 being processed. In this way, foreign particles 10 may adhere to the surface of the wafer 6 being processed and may cause defects in the silicon oxide film 12 being formed. Thus, it has been difficult to form high-quality thin films with a high yield.

SUMMARY OF THE INVENTION

The present invention has been made in order to overcome the above-described problems. It is an object of the present invention to provide a thin film-forming apparatus capable of forming high-quality thin films with a high yield.

A thin film-forming apparatus according to the present invention comprises: a reaction chamber; holding means for holding an object for processing within the reaction chamber; gas introduction means for introducing at least one reaction gas into the reaction chamber; electrode means disposed at the periphery of the object for processing held by the holding means for capturing particles which do not contribute to the formation of a thin film on the object for processing; and a power source for applying direct-current voltage to the electrode means.

DESCRIPTION OF THE PREFERRED EMBODIMENTS

Embodiments of the present invention will be described hereunder with reference to the accompanying drawings.

Figure 1:
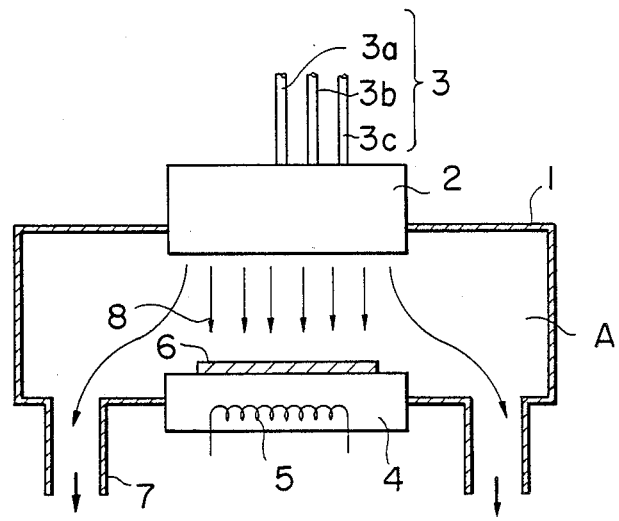
FIG. 1 is a sectional view of a conventional thin film-forming apparatus.
Figure 2:
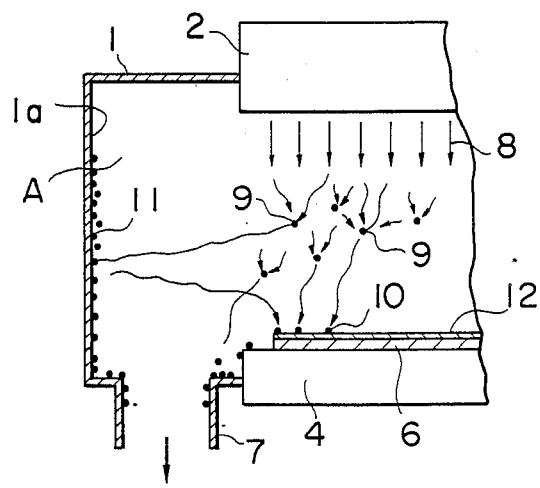
FIG. 2 is a fragmentary sectional view illustrating problems encountered with the conventional apparatus.
Figure 3:
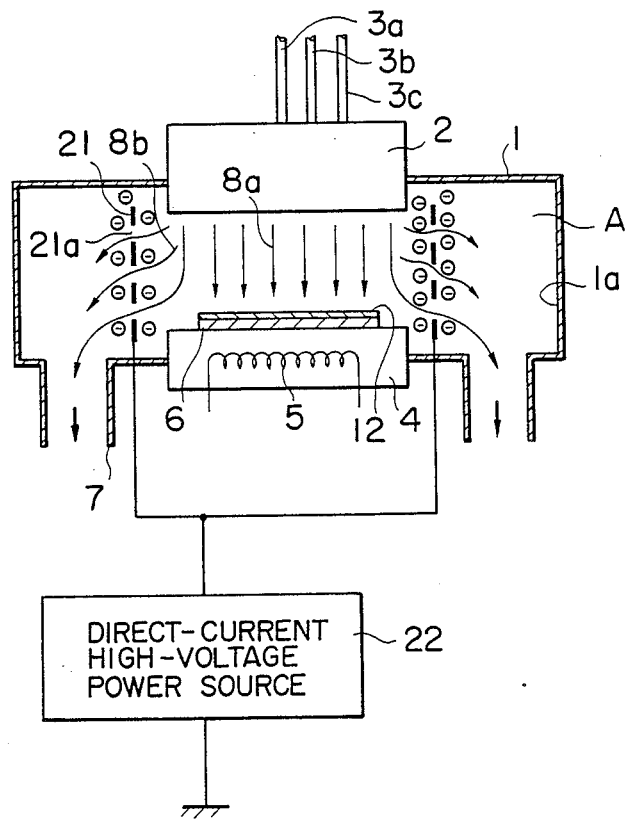
FIG. 3 is a sectional view of a thin film-forming apparatus in accordance with an embodiment of the present invention.

Referring to FIG. 3, there is shown a thin film-forming apparatus in accordance with an embodiment of the present invention. The apparatus has a vessel 1 defining a reaction chamber A. A gas dispersion head 2 is disposed on the upper portion of the vessel 1 facing the inside of the reaction chamber A. Gas supply pipes 3a to 3c are connected at one of their respective ends to the gas dispersion head 2, the other ends of these gas supply pipes 3a to 3c being connected to an unillustrated gas supply device. The apparatus also has a stage 4 serving as the holding means. The stage 4 is disposed on the lower portion of the vessel 1 opposing the gas dispersion head 2. A heater 5 is accommodated in the stage 4 so that an object to be processed which is placed upon the stage 4 can be heated to a desired temperature. A cylindrical electrostatic plate electrode 21 is disposed within the reaction chamber A surrounding the gas dispersion head 2 and the stage 4 which oppose each other, and is connected to a direct-current high-voltage power source 22 disposed outside of the vessel 1. The electrostatic plate electrode 21 comprises a metal plate formed of, e.g., stainless steel, aluminum, copper, or molybdenum. The electrode 21 is disposed within the reaction chamber A in such a manner as to allow its disassembly therefrom. A plurality of openings 21a are formed in the electrode 21, thereby allowing gases within the reaction chamber A to flow therethrough. An exhaust port 7 is formed in the bottom portion of the vessel 1 and on the outer side with respect to the electrostatic plate electrode 21, thereby allowing a part of the gases within the reaction chamber A to be exhausted to the outside.

Next, explanations will be given concerning a method of forming a silicon oxide film using the thin film-forming apparatus. First, a wafer 6, is conveyed into the reaction chamber A through a conveyance port (not shown) of the vessel 1, and placed upon the stage 4. The stage 4 has been heated by the heater 5 and has a predetermined temperature of, e.g., 350 to 450° C. Also, a negative voltage of, e.g., about 500 V to 10 kV, is applied to the electrostatic plate electrode 21 by the direct-current high-voltage power source 22.

Subsequently, monosilane (SiH$_4$) gas and oxygen (O$_2$) gas, as reaction gases, as well as nitrogen (N$_2$) gas, as a carrier gas, are supplied from a gas supply device (not shown) into the dispersion head 2 through the gas supply pipes 3a and 3c, respectively. These gases are then injected in their mixed state through the nozzles (not shown) of the gas dispersion head 2 into the reaction chamber A. A part of the gases injected through the central portion of the gas dispersion head 2 flows vertically downward forming a flow 8a, such as that shown in FIG. 3, whereby it is evenly supplied to the surface of the wafer 6 upon the stage 4. As a result, the reaction expressed by the following formula takes place on the surface of the wafer 6, thereby forming a silicon oxide film 12 on the wafer 6:

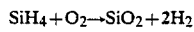

$$SiH_4 + O_2 \rightarrow SiO_2 + 2H_2$$

On the other hand, another part of the gases supplied into the reaction chamber A through the peripheral portion of the gas dispersion head 2 does not reach the stage 4. Instead, this part of the gases forms the flow indicated at 8b in FIG. 3, which passes through the openings 21a of the electrostatic plate electrode 21, and then is directly exhausted through the exhaust port 7 to the outside of the vessel 1.

Figure 4:
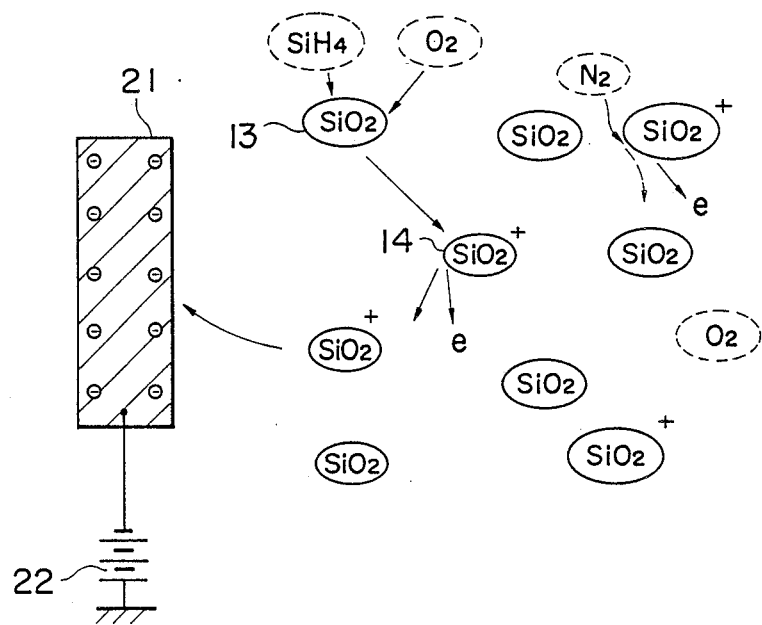
FIG. 4 is a schematic illustration used to explain the operation of the embodiment.

At this time, in the atmosphere above the wafer 6, the reaction expressed by the above-mentioned formula results in the formation of silicon oxide molecules (SiO$_2$) 13, as shown in FIG. 4. These molecules 13 undergo thermal motion determined by the temperature conditions within the reaction chamber A, whereby some of the molecules 13 collide with one another. The molecules which have collided have their outermost outer-shell electrons excited by the collision. Consequently, these molecules are transformed into positively charged particles (SiO$_2$+) 14.

As explained before, since a negative voltage of, e.g., about 500 V to 10 kV is applied to the electrostatic plate electrode 21, the surface of the electrode 21 is negatively charged. As a result, some of the positively charged particles (SiO$_2$+) 14 which are in the vicinity of the electrostatic plate electrode 21 are attracted to the electrode 21 and captured thereby. The captured particles 14 are then held on the electrode 21 by Coulomb forces.

By virtue of this action, a reduction occurs in the density of the silicon oxide molecules (SiO$_2$) 13 in the vicinity of the electrostatic plate electrode 21. This reduction causes the silicon oxide molecules (SiO$_2$) 13 within the entire atmosphere to diffuse toward low-density areas where they will be evenly distributed again. Thus, the above-described actions sequentially take place, causing positively charged particles (SiO$_2$+) 14 to be attracted to the electrostatic plate electrode 21. Once a positively charged particle is attracted in this way, it is held in place by the Coulomb force. Therefore, in the atmosphere above the wafer 6, it is possible to prevent the cohesion of silicon oxide molecules (SiO$_2$) 13 which do not contribute to the formation of the silicon oxide film 12 and, hence, to prevent the adhesion of these molecules 13 to the wafer 6 where they act as foreign particles.

Even if the above-described arrangement is adopted, since some of the gases which have passed through the openings 21a of the electrostatic plate electrode 21 reach the inner wall 1a of the vessel 1, there is a risk that a deposit may be formed by silicon oxide (SiO$_2$) molecules 13. However, the ground of the deposit can be reduced. Moreover, even when part of the deposit peels off from the inner wall 1a, the electrostatic plate electrode 21 serves as a shield, whereby the peeled-off deposit is prevented from reaching the surface of the wafer 6, and is, instead, exhausted through the exhaust port 7.

In this way, with the above-described arrangement, it is possible to reduce the risk of foreign particles, which might result from the cohesion of part of the silicon oxide molecules 13 within the atmosphere or from a deposit on the inner wall surface of the vessel 1, adhering to the surface of the wafer 6. It is therefore possible to form the silicon oxide layer 12 on the surface of the wafer 6 while assuring its high quality.

The electrostatic plate electrode 21 can be disassembled. This arrangement is advantageous in that, during such operations as cleaning, when the application of voltage to the electrostatic plate 21 has been interrupted, the electrode 21 can be replaced with another electrostatic plate electrode 21 previously prepared. Thus, the time required for the cleaning operation can be curtailed. Furthermore, since there is no risk of foreign particles scattering from the inside of the vessel 1 during such operations as cleaning, it is possible to prevent any deterioration in the cleanliness of the periphery of the apparatus.

Figure 5:
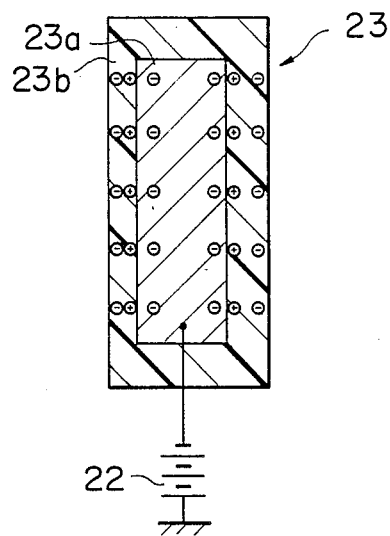
FIG. 5 is a sectional view of an additional apparatus in accordance with an embodiment of the present invention.

Although in the foregoing embodiment, the electrostatic plate electrode 21 is formed of a metal, an electrostatic plate electrode 23, such as that shown in FIG. 5, may be alternatively be used. Referring to FIG. 5, this electrode 23 comprises a conductor plate 23a formed of, e.g., carbon, and an insulating film 23b, such as a silicon oxide film or an alumina film, coating the surface of the conductor plate 23a with a thickness of several $\mu$m to several hundred $\mu$m. If the electrode 23 is used, when direct-current voltage is applied from the power source 22 to the conductor plate 23a, the portion of the insulating film 23b which is in contact with the conductor plate 23a is positively charged while the surface portion of the insulating film 23b is negatively charged. Therefore, it is possible to capture positively charged particles ($SiO_2+$) with an enhanced efficiency.

Figure 6:
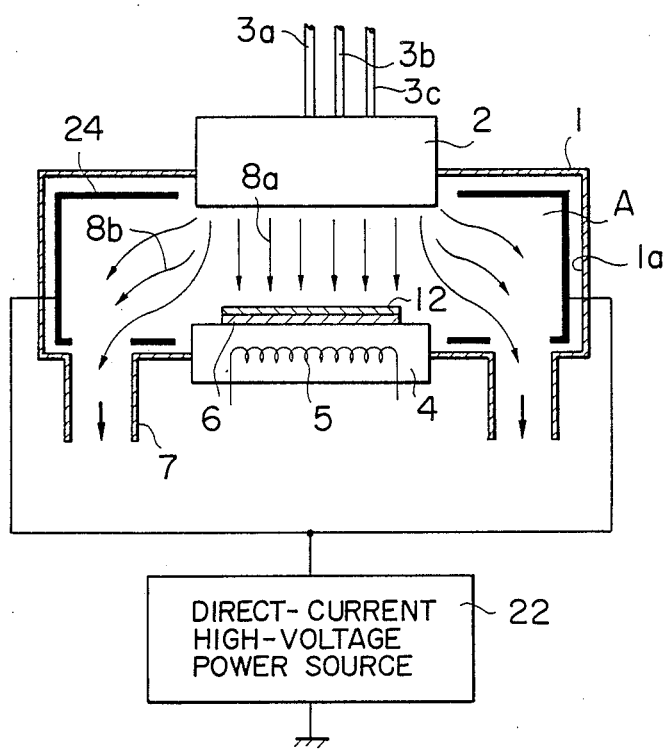
FIG. 6 is a sectional view showing still another embodiment of the present invention.

FIG. 6 shows a still another embodiment of the present invention. In this embodiment, an electrostatic plate electrode 24 is disposed along the inner wall 1a of the vessel 1. With this arrangement, therefore, a large area is covered by the electrostatic plate electrode 24, thereby making it possible to further enhance the efficiency with which positively charged particles ($SiO_2+$) are captured.

Although the descriptions given above concern the case where positively charged particles 14 are produced by the collision of silicon oxide molecules 13, when negatively charged particles are produced within the reaction chamber A, a positive voltage should be applied to the electrostatic plate electrode 21, 23, or 24.

The application of the present invention is not limited to the formation of silicon oxide films, and the present invention may be applied to the formation of thin films of various types. Further, wafers of various types may be used as the wafer 6, and they include single crystal silicon wafers and GaAs wafers. In addition, a plurality of wafers 6 may be held in place upon the stage 4 so that thin film are simultaneously formed on them.

What is claimed is:

1. A thin film-forming apparatus comprising:
    a reaction chamber;
    holding means for holding an object for processing within said reaction chamber;
    gas introduction means for introducing at least one reaction gas into said reaction chamber;
    electrode means comprising an electrically conductive plate coated with an electrically insulating film and disposed within said reaction chamber for electrostatically capturing particles which do not contribute to the formation of a thin film on the object; and
    a power source for applying a direct-current voltage to said plate.

2. An apparatus according to claim 1 wherein said electrode means is disposed at the periphery of said holding means and includes openings for the flow therethrough of gases within said reaction chamber.

3. An apparatus according to claim 1 wherein said reaction chamber includes walls and said electrode means is disposed along said walls.

4. An apparatus according to claim 1 wherein said electrode means is removable from said reaction chamber.

5. An apparatus according to claim 1 comprising heating means for heating the object.

* * * * *